United States Patent
Suzuki et al.

(10) Patent No.: US 8,603,729 B2
(45) Date of Patent: Dec. 10, 2013

(54) LITHOGRAPHIC PRINTING PLATE PRECURSOR AND PLATE MAKING METHOD THEREOF

(75) Inventors: Shota Suzuki, Shizuoka (JP); Yuriko Ishiguro, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 135 days.

(21) Appl. No.: 13/221,545

(22) Filed: Aug. 30, 2011

(65) Prior Publication Data

US 2012/0052442 A1 Mar. 1, 2012

(30) Foreign Application Priority Data

Aug. 31, 2010 (JP) ................................. 2010-195224

(51) Int. Cl.
*G03F 7/09* (2006.01)
*G03F 7/11* (2006.01)
*B41N 1/08* (2006.01)

(52) U.S. Cl.
USPC ..................... 430/273.1; 430/271.1; 430/302; 101/453; 101/463.1

(58) Field of Classification Search
USPC ............ 430/271.1, 273.1, 300, 302; 101/453, 101/463.1
See application file for complete search history.

(56) References Cited

U.S. PATENT DOCUMENTS

| | | | | |
|---|---|---|---|---|
| 6,632,589 B2 * | 10/2003 | Inno et al. | ..................... | 430/303 |
| 2001/0018159 A1 | 8/2001 | Maemoto | | |
| 2002/0177074 A1 | 11/2002 | Hoshi et al. | | |
| 2005/0069811 A1 | 3/2005 | Mitsumoto et al. | | |
| 2007/0214987 A1 * | 9/2007 | Sonokawa et al. | ............ | 101/454 |
| 2012/0219911 A1 * | 8/2012 | Suzuki et al. | .............. | 430/283.1 |

FOREIGN PATENT DOCUMENTS

| EP | 1 518 672 A2 | 3/2005 |
|---|---|---|
| EP | 1 839 853 A1 | 10/2007 |
| EP | 2 006 091 A2 | 12/2008 |
| JP | 2001-277740 A | 10/2001 |
| JP | 2001-277742 A | 10/2001 |
| JP | 2002-287334 A | 10/2002 |
| JP | 2004-322575 * | 11/2004 |
| JP | 2005-119273 A | 5/2005 |
| JP | 2008-162056 A | 7/2008 |
| JP | 4162365 B2 | 10/2008 |

OTHER PUBLICATIONS

Machine translation of JP 2004-322575, published on Nov. 18, 2004.*
Extended European Search Report issued on Dec. 1, 2011 in corresponding European patent application No. 11179274.3.

* cited by examiner

*Primary Examiner* — Anca Eoff
(74) *Attorney, Agent, or Firm* — Birch, Stewart, Kolasch & Birch, LLP

(57) ABSTRACT

A lithographic printing plate precursor includes, in the following order: a support; an image-recording layer which is capable of forming an image by removing an unexposed area with at least one of printing ink and dampening water on a printing machine after exposure and contains (A) an infrared absorbing dye, (B) a polymerization initiator, (C) a polymerizable compound and (D) a binder polymer having an alkylene oxide group; and a protective layer containing (E) a hydrophilic polymer containing at least a repeating unit represented by the formula (1) as defined herein and a repeating unit represented by the formula (2) as defined herein.

8 Claims, No Drawings

LITHOGRAPHIC PRINTING PLATE PRECURSOR AND PLATE MAKING METHOD THEREOF

FIELD OF THE INVENTION

The present invention relates to a lithographic printing plate precursor and a plate making method thereof. More particularly, it relates to a lithographic printing plate precursor capable of undergoing a direct plate making by image exposure with laser and capable of undergoing on-press development and a plate making method including on-press development.

BACKGROUND OF THE INVENTION

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as an "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing step.

Also, as a method of simple development, a method referred to as a "gum development" is practiced wherein the removal of the unnecessary area of image-recording layer is performed using not a conventional high alkaline developer but a finisher or gum solution of near-neutral pH.

In the simplification of plate making operation as described above, a system using a lithographic printing plate precursor capable of being handled in a bright room or under a yellow lump and a light source is preferable from the standpoint of workability. Thus, as the light source, a semiconductor laser emitting an infrared ray having a wavelength of 760 to 1,200 or a solid laser, for example, YAG laser, is used. An UV laser is also used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein is described in JP-A-2001-277740 (the term "JP-A" as used herein means an "unexamined published Japanese patent application") or JP-A-2001-277742. Also, a lithographic printing plate precursor having provided on a support, an image-recording layer (photosensitive layer) containing an infrared absorbing agent, a radical polymerization initiator and a polymerizable compound is described in JP-A-2002-287334.

It is proposed to incorporate a cellulose into a protective layer in order to impart ink receptivity in Japanese Patent 4162365 or JP-A-2008-162056. However, the technique is insufficient in view of balance between the ink receptivity or printing durability and the on-press development property.

Further, a lithographic printing plate precursor having provided on a support, an image-recording layer capable of being removed with either printing ink, dampening water or both of them containing an actinic radiation absorber, a polymerization initiator and a polymerizable compound and a protective layer (overcoat layer) containing an inorganic stratiform compound in this order is described in JP-A-2005-119273.

However, the technique has a problem in that a polyvinyl alcohol resin and an inorganic stratiform compound which has a hydrophilic surface get into the image-recording layer during the coating and drying stages and the image-recording layer is cured as it is by exposure to from the image area so that the ink receptivity is deteriorated at the initiation of printing and on the way of printing.

SUMMARY OF THE INVENTION

An object of the present invention is to provide a lithographic printing plate precursor for making a lithographic printing plate which overcomes the problems in the prior art described above and its plate making method. Specifically, it is to provide a lithographic printing plate precursor which has good on-press development property and can make a lithographic printing plate having good ink receptivity and exhibiting high printing durability and its plate making method.

The present invention includes the following items.

(1) A lithographic printing plate precursor comprising, in the following order: a support; an image-recording layer which is capable of forming an image by removing an unexposed area with at least any of printing ink and dampening water on a printing machine after exposure and contains (A) an infrared absorbing dye, (B) a polymerization initiator, (C) a polymerizable compound and (D) a binder polymer having an alkylene oxide group; and a protective layer containing (E) a hydrophilic polymer containing at least a repeating unit represented by formula (1) shown below and a repeating unit represented by formula (2) shown below.

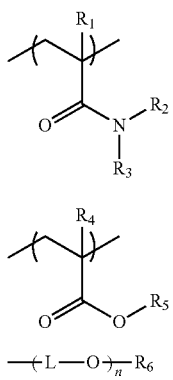

Formula (1)

Formula (2)

Formula (3)

In formulae (1) and (2), $R_1$ and $R_4$ each independently represents a hydrogen atom or a methyl group, $R_2$ and $R_3$, which may be the same or different, each independently represents a hydrogen atom, a methyl group or an ethyl group, and $R_5$ represents an unsubstituted straight-chain, branched or cyclic alkyl group having from 2 to 8 carbon atoms, a substituted alkyl group which may have an aromatic ring or a heterocyclic ring as a substituent or a substituent represented by formula (3) shown above, and in formula (3), L represents an alkylene group having from 2 to 6 carbon atoms, $R_6$ represents an unsubstituted straight-chain, branched or cyclic alkyl group having from 4 to 8 carbon atoms or an aromatic group-substituted alkyl group, and n means an average addition molar number of polyether and represents a number from 2 to 4.

(2) The lithographic printing plate precursor as described in (1) above, wherein the repeating unit represented by formula (1) is a repeating unit derived from acrylamide or methacrylamide and $R_5$ in the repeating unit represented by formula (2) is an unsubstituted straight-chain, branched or cyclic alkyl group having from 2 to 8 carbon atoms.

(3) The lithographic printing plate precursor as described in (1) or (2) above, wherein the protective layer contains (F) an inorganic stratiform compound.

(4) The lithographic printing plate precursor as described in any one of (1) to (3) above, wherein the image-recording layer further contains (G) a hydrophobilizing precursor.

(5) A plate making method comprising exposing imagewise the lithographic printing plate precursor as described in any one of (1) to (4) above and then removing an unexposed area of the image-recording layer by supplying at least any of printing ink and dampening water on a printing machine.

According to the present invention, the object of providing a lithographic printing plate precursor which has good on-press development property and can make a lithographic printing plate having good ink receptivity and exhibiting high printing durability and its plate making method can be achieved by incorporating (D) the binder polymer having an alkylene oxide group into the image-recording layer and incorporating (E) the hydrophilic polymer containing repeating units having the specific structures into the protective layer.

The functional mechanism of the invention is not quite clear but it is estimated as follows.

Heretofore, when (D) the binder polymer having an alkylene oxide group is incorporated into an image-recording layer in order to impart on-press development property, a problem arises in that a hydrophilic polymer and/or (F) the inorganic stratiform compound in a protective layer undergo interlayer mixing with the component of the image-recording layer at the time of drying of the protective layer and remain in the image area after development to cause degradation of ink receptivity.

In case of using a conventional hydrophilic binder polymer which ensures water solubility by including an acid group or a salt thereof in its molecule, hydrophilicity increases in the image-recording layer and protective layer so that the compatibility between ink receptivity and developing property becomes difficult. In particular, as for a lithographic printing plate precursor of on-press development type having a protective layer containing an inorganic stratiform compound, increase in the ink receptivity is more difficult.

On the contrary, when (E) the hydrophilic polymer according to the invention in which a hydrophilic component represented by formula (1) and a hydrophobic component represented by formula (2) which it self has an extremely low water solubility are copolymerized in a range of maintaining the water solubility is used in a protective layer, the ink receptivity is good even when (D) the binder polymer having an alkylene oxide group is incorporated into an image-recording layer.

It is estimated that this is because (E) the hydrophilic polymer according to the invention inhibits mixing the component of the protective layer with the component of the image-recording layer even in the case where the protective layer contains (F) the inorganic stratiform compound so that the component of the protective layer can be rapidly removed at the on-press development.

Also, according to the invention the unexpected result is obtained, in which degradation of the ink receptivity that tends to occur with a lithographic printing plate precursor after preservation in case of using a specific color ink does not occur at all.

As described above, the present invention is a technique relating to a novel polymer for protective layer of a lithographic printing plate precursor of on-press development type which is not expected from the prior art and makes the remarkable improvement in practical performance possible.

According to the present invention, a lithographic printing plate precursor which has good on-press development property and can make a lithographic printing plate having good ink receptivity and exhibiting high printing durability and its plate making method can be provided.

DETAILED DESCRIPTION OF THE INVENTION

The present invention will be described in detail below.
[Lithographic Printing Plate Precursor]

The lithographic printing plate precursor according to the invention comprises, in the following order: a support; an image-recording layer which is capable of forming an image by removing an unexposed area with at least any of printing ink and dampening water on a printing machine; and a protective layer. The phrase "in the following order" does not exclude the possibility that any other layer(s) is provided between the support and the image-recording layer or between the image-recording layer and the protective layer. The lithographic printing plate precursor according to the invention may have an undercoat layer between the support and the image-recording layer.

Hereinafter, the constituting elements, components and the likes of the lithographic printing plate precursor according to the invention will be described.

(Protective Layer)

The protective layer according to the invention is characterized by containing (E) a hydrophilic polymer containing at least a repeating unit represented by formula (1) shown below and a repeating unit represented by formula (2) shown below.

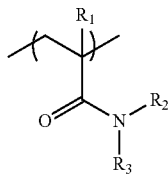

Formula (1)

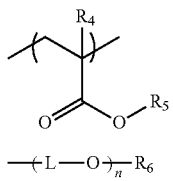

Formula (2)

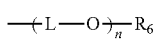

Formula (3)

In formulae (1) and (2), $R_1$ and $R_4$ each independently represents a hydrogen atom or a methyl group, and $R_2$ and $R_3$, which may be the same or different, each independently represents a hydrogen atom, a methyl group or an ethyl group. $R_2$ and $R_3$ each preferably represents a hydrogen atom or a methyl group, and $R_2$ and $R_3$ each more preferably represents a hydrogen atom from the standpoint of water solubility.

$R_5$ represents an unsubstituted straight-chain, branched or cyclic alkyl group having from 2 to 8 carbon atoms, a substituted alkyl group which may have an aromatic ring or a heterocyclic ring as a substituent or a substituent represented by formula (3) shown above. $R_5$ preferably represents an unsubstituted straight-chain, branched or cyclic alkyl group having from 2 to 8 carbon atoms or a substituent represented by formula (3). From the standpoint of ink receptivity, a branched alkyl group having from 2 to 8 carbon atoms is more preferred. An alkyl group having from 2 to 6 carbon atoms is more preferred, and from the standpoint of ink receptivity and water solubility, an alkyl group having from 3 or 4 carbon atoms is most preferred.

In formula (3), L represents an alkylene group having from 2 to 6 carbon atoms, $R_6$ represents an unsubstituted straight-chain, branched or cyclic alkyl group having from 4 to 8 carbon atoms or an aromatic group-substituted alkyl group, and n means an average addition molar number of polyether and represents a number from 2 to 4.

Of the combinations of the repeating units represented by formulae (1) and (2) respectively, a combination where $R_1$ and $R_4$ in formulae (1) and (2) are both hydrogen atoms, $R_2$ and $R_3$ in formulae (1) are both hydrogen atoms and $R_5$ in formulae (2) is an unsubstituted branched alkyl group having from 3 or 4 carbon atoms is most preferred.

Further, from the standpoint of ink receptivity, it is important that the hydrophilic polymer does not contain a hydroxy group, a carboxylic acid group, a sulfonic acid group, a phosphoric acid group, a phosphonic acid group or a salt thereof.

Specific examples of a monomer from which the repeating unit represented by formula (1) is derived include acrylamide, methacrylamide, N-methylacrylamide, N-methylmethacrylamide, N-ethylacrylamide, N-ethylmethacrylamide, N,N-dimethylacrylamide, N,N-dimethylmethacrylamide, N,N-diethylacrylamide, N,N-diethylmethacrylamide, N,N-ethylmethylacrylamide and N,N-ethylmethylmethacrylamide.

Specific examples of a monomer from which the repeating unit represented by formula (2) is derived include methyl acrylate, ethyl acrylate, propyl acrylate, isopropyl acrylate, n-butyl acrylate, isobutyl acrylate, tert-butyl acrylate, pentyl acrylate, hexyl acrylate, cyclohexyl acrylate, heptyl acrylate, octyl acrylate, 2-ethylhexyl acrylate, nonyl acrylate, decanyl acrylate, methyl methacrylate, ethyl methacrylate, propyl methacrylate, isopropyl methacrylate, n-butyl methacrylate, isobutyl methacrylate, tert-butyl methacrylate, pentyl methacrylate, hexyl methacrylate, cyclohexyl methacrylate, heptyl methacrylate, octyl methacrylate, 2-ethylhexyl methacrylate, nonyl methacrylate and decanyl methacrylate.

Of the hydrophilic polymers (E) according to the invention, those containing from 70 to 95% by mole of the repeating unit represented by formula (1) and from 5 to 30% by mole of the repeating unit represented by formula (2) are preferred, those containing from 70 to 80% by mole of the repeating unit represented by formula (1) and from 20 to 30% by mole of the repeating unit represented by formula (2) are more preferred, and those containing from 75 to 80% by mole of the repeating unit represented by formula (1) and from 20 to 25% by mole of the repeating unit represented by formula (2) are most preferred.

The weight average molecular weight (Mw) of the hydrophilic polymer is preferably from 10,000 to 200,000, more preferably from 10,000 to 100,000, and most preferably from 10,000 to 30,000.

Specific examples of the hydrophilic polymer (E) are set forth in Tables 1 to 9 below. The numbers in the tables indicate compound numbers of the hydrophilic polymer compounds and correspond to the compound numbers used in the examples described hereinafter, respectively.

The content of the hydrophilic polymer in the protective layer is preferably 40% by weight or more, more preferably 60% by weight or more, particularly preferably 80% by weight or more, based on the solid content of the protective layer. In the range described above, the lithographic printing plate precursor exhibits good ink receptivity, good on-press development property and good printing durability is obtained.

TABLE 1

Composition Ratio of Formula (1) and Formula (2) = 80/20 (% by mole), Mw = 30,000

TABLE 1-continued
Composition Ratio of Formula (1) and Formula (2) = 80/20 (% by mole), Mw = 30,000
| | Formula (1) | | | | |
|---|---|---|---|---|---|
| | 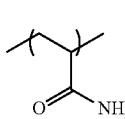 | 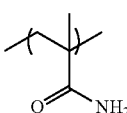 | 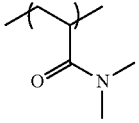 | 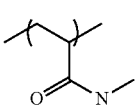 | 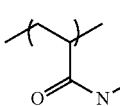 |
| 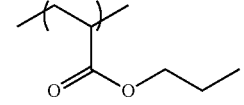 | 2 | 11 | 20 | 29 | 38 |
| 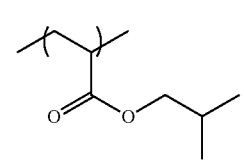 | 3 | 12 | 21 | 30 | 39 |
| 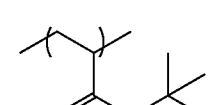 | 4 | 13 | 22 | 31 | 40 |
| 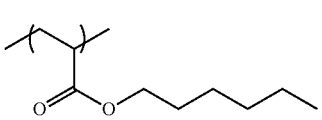 | 5 | 14 | 23 | 32 | 41 |
| 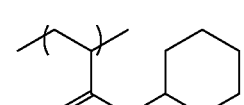 | 6 | 15 | 24 | 33 | 42 |
| 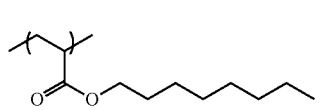 | 7 | 16 | 25 | 34 | 43 |
| 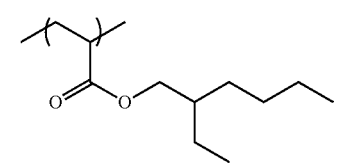 | 8 | 17 | 26 | 35 | 44 |
|  | 9 | 18 | 27 | 36 | 45 |

TABLE 2

Composition Ratio of Formula (1) and Formula (2) = 80/20 (% by mole), Mw = 30,000

| | | Formula (1) | |
|---|---|---|---|
| | | acrylamide (–C(=O)NH₂) | methacrylamide (–C(=O)NH₂) |
| Formula (2) | ethyl ester | 46 | 55 |
| | propyl ester | 47 | 56 |
| | butyl ester | 48 | 57 |
| | isobutyl ester | 49 | 58 |
| | tert-butyl ester | 50 | 59 |
| | hexyl ester | 51 | 60 |
| | cyclohexyl ester | 52 | 61 |
| | octyl ester | 53 | 62 |
| | 2-ethylhexyl ester | 54 | 63 |

TABLE 3
Composition Ratio of Formula (1) and Formula (2) = 80/20 (% by mole), Mw = 30,000
| | | Formula(1) 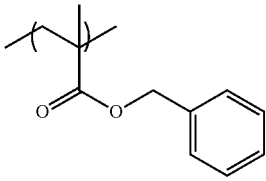 | Formula(1) 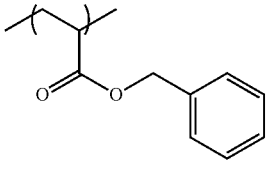 |
|---|---|---|---|
| Formula (2) | 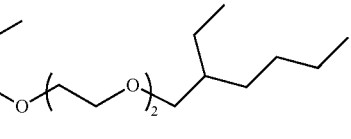 | 64 | 73 |
| | 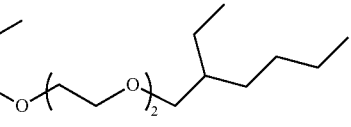 | 65 | 74 |
| | 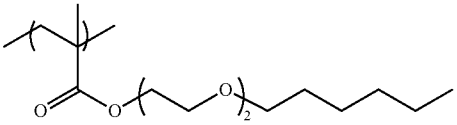 | 66 | 75 |
| | 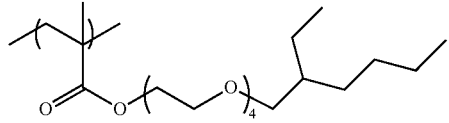 | 67 | 76 |
| | 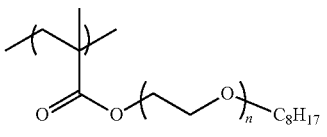 | 68 | 77 |
| | 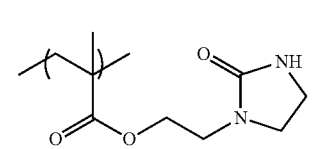 | 69 | 78 |
| | n ≒ 4 | 70 | 79 |
| | | 71 | 80 |

TABLE 3-continued

Composition Ratio of Formula (1) and Formula (2) = 80/20 (% by mole), Mw = 30,000

| | Formula(1) | |
|---|---|---|
| | [acrylamide structure] | [methacrylamide structure] |
| [pyrazole carbamate ethyl methacrylate structure] | 72 | 81 |

TABLE 4

Composition Ratio of Formula (1) and Formula (2) = 80/20 (% by mole)

| | | Formula (1) [acrylamide structure] | | | | |
|---|---|---|---|---|---|---|
| | | Mw | | | | |
| | | 200,000 | 100,000 | 50,000 | 30,000 | 10,000 |
| Formula (2) | [n-butyl acrylate] | 82 | 83 | 84 | 3 | 85 |
| | [isobutyl acrylate] | 86 | 87 | 88 | 4 | 89 |
| | [tert-butyl acrylate] | 90 | 91 | 92 | 5 | 93 |

TABLE 5
Composition Ratio of Formula (1) and Formula (2) = 80/20 (% by mole)
Formula (1)
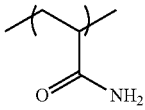
| | | Mw | | | | |
|---|---|---|---|---|---|---|
| | | 200,000 | 100,000 | 50,000 | 30,000 | 10,000 |
| Formula (2) | 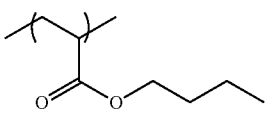 | 94 | 95 | 96 | 12 | 97 |
| | 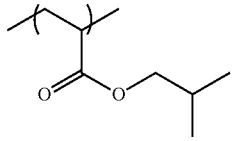 | 98 | 99 | 100 | 13 | 101 |
| | 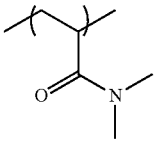 | 102 | 103 | 104 | 14 | 105 |
TABLE 6
Composition Ratio of Formula (1) and Formula (2) = 80/20 (% by mole)
Formula (1)
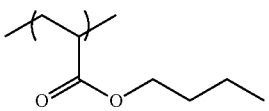
| | | Mw | | | | |
|---|---|---|---|---|---|---|
| | | 200,000 | 100,000 | 50,000 | 30,000 | 10,000 |
| Formula (2) | 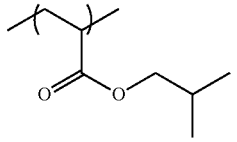 | 106 | 107 | 108 | 21 | 109 |
| | | 110 | 111 | 112 | 22 | 113 |
| | | 114 | 115 | 116 | 23 | 117 |

TABLE 7

Specific Examples changing Composition Ratio of Formula (1) and Formula (2), Mw = 30,000

Formula (1)
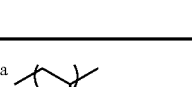

| | | Composition Ratio (% by mole) | | | | |
|---|---|---|---|---|---|---|
| | | 95/5 | 90/10 | 85/15 | 80/20 | 70/30 |
| Formula (2) | 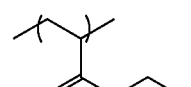 | 118 | 119 | 120 | 3 | 121 |
| | 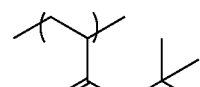 | 122 | 123 | 124 | 4 | 125 |
| | 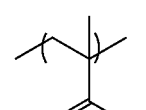 | 126 | 127 | 128 | 5 | 129 |

TABLE 8

Specific Examples changing Composition Ratio of Formula (1) and Formula (2), Mw = 30,000

Formula (1)
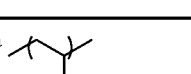

| | | Composition Ratio (% by mole) | | | | |
|---|---|---|---|---|---|---|
| | | 95/5 | 90/10 | 85/15 | 80/20 | 70/30 |
| Formula (2) | 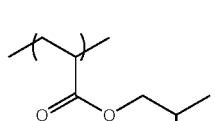 | 130 | 131 | 132 | 12 | 133 |
| | 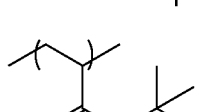 | 134 | 135 | 136 | 13 | 137 |
| | 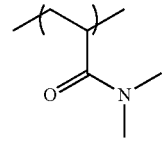 | 138 | 139 | 140 | 14 | 141 |

TABLE 9

Specific Examples changing Composition Ratio of Formula (1) and Formula (2), Mw = 30,000

Formula (1)
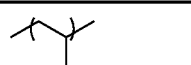

| | | Composition Ratio (% by mole) | | | |
|---|---|---|---|---|---|
| | | 95/5 | 90/10 | 80/20 | 70/30 |
| Formula (2) |  | 142 | 143 | 21 | 144 |
| |  | 145 | 146 | 22 | 147 |
| | | 148 | 149 | 23 | 150 |

(F) Inorganic Stratiform Compound

The protective layer according to the invention preferably contains an inorganic stratiform compound in order to obtain good oxygen-blocking property with a thin layer.

The inorganic stratiform compound is a particle having a thin tabular shape and includes, for instance, mica, for example, natural mica represented by the following formula: $A(B, C)_{2-5} D_4 O_{10} (OH, F, O)_2$, (wherein A represents any of Li, K, Na, Ca, Mg and an organic cation, B and C each represents any of Fe (II), Fe(III), Mn, Al, Mg and V, and D represents Si or Al) or synthetic mica, talc represented by the following formula: $3MgO.4SiO.H_2O$, teniolite, montmorillonite, saponite, hectolite and zirconium phosphate.

Examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{25}(Si_4O_{10})F_2$, Na or Li teniolite (Na, Li)$Mg_2Li(Si_4O_{10})F_2$, or montmorillonite based Na or Li hectolite (Na, Li)$_{1/8}$Mg$_{2/5}$Li$_{1/8}$(Si$_4$O$_{10}$)F$_2$. Synthetic smectite is also useful.

Of the inorganic stratiform compounds, mica is preferred and fluorine-based swellable mica, which is a synthetic inorganic stratiform compound, is particularly useful. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Li^+$, $Na^+$, $Ca^{2+}$, $Mg^{2+}$ or an organic cation is adsorbed between the lattice layers. The inorganic stratiform compound swells upon contact with water. When share is applied under such condition, the stratiform crystal lattices are easily cleaved to form a stable sol in water. The bentnite and swellable synthetic mica have strongly such tendency.

As for the shape of the inorganic stratiform compound, from the standpoint of control of diffusion, the thinner the thickness or the larger the plain size as long as smoothness of coated surface and transmission of actinic radiation are not damaged, the better. Therefore, an aspect ratio of the inorganic stratiform compound is preferably 20 or more, more preferably 100 or more, and particularly preferably 200 or more. The aspect ratio is a ratio of major axis to thickness of particle and can be determined, for example, from a projection drawing of particle by a microphotography. The larger the aspect ratio, the greater the effect obtained.

A suitable total amount of the stratiform compound is changed due to the kind of the compound. However, in general, it is preferably from 3 to 80% by weight, more preferably from 5 to 70% by weight and particularly preferably from 10 to 60% by weight, based on the total solid content of the protective layer. If the amount is within the preferable range, oxygen-blocking property is improved and sensitivity is also improved, and the deterioration of ink receptive property can be prevented.

As for a particle diameter of the inorganic stratiform compound, an average diameter is ordinarily from 1 to 20 μm, preferably from 1 to 10 μm, and particularly preferably from 2 to 5 μm. When the particle diameter is 1 μm or more, the inhibition of permeation of oxygen or moisture is sufficient and the effect of the inorganic stratiform compound can preferably be satisfactorily achieved. On the other hand, when it is 20 μm or less, the dispersion stability of the particle in the coating solution is sufficient to preferably conduct the stable coating. An average thickness of the particle is preferably 0.1 μm or less, more preferably 0.05 μm or less, and particularly preferably 0.01 μm or less. For example, with respect to the swellable synthetic mica that is the representative compound of the inorganic stratiform compound, the thickness is preferably approximately from 1 to 50 nm and the plain size is preferably approximately from 1 to 20 μm.

When such an inorganic stratiform compound particle having a large aspect ratio is incorporated into the protective layer, strength of the coated layer increases and penetration of oxygen or moisture can be effectively inhibited and thus, the protective layer can be prevented from deterioration due to deformation, and even when the lithographic printing plate precursor is preserved for a long period of time under a high humidity condition, it is prevented from decrease in the image-forming property of the lithographic printing plate precursor due to the change of humidity and the effect of excellent preservation stability can be obtained.

Further, to the protective layer can be added a fluorine-based compound, a silicone-based compound or a wax-based emulsion in order to prevent tackiness. When such a compound is added, the compound moves to the surface of the protective layer so that the tackiness resulting from the hydrophilic polymer disappears. The amount of the compound added is preferably from 0.1 to 5% by weight, and more preferably from 0.5 to 2.0% by weight, of the protective layer.

To the coating solution for protective layer can be added known additives, for example, an anionic surfactant, a nonionic surfactant, a cationic surfactant or a fluorine-based surfactant for improving the coating property or a water-soluble plasticizer for improving the physical property of the protective layer. Examples of the water-soluble plasticizer include propionamide, cyclohexane diol, glycerin and sorbitol. Further, to the coating solution for protective layer may be added known additives for improving properties, for example, adhesion property to the image-recording layer, time-lapse stability of the coating solution or ink receptive property.

The protective layer can be coated on the image-recording layer by a known method. The coating amount of the protective layer is preferably in a range form 0.01 to 10 g/m², more preferably in a range from 0.02 to 3 g/m², most preferably in a range from 0.02 to 1 g/m², in terms of the coating amount after drying.

(Image-Recording Layer)

The image-recording layer according to the invention is an image-recording layer which is capable of forming an image by removing an unexposed area with at least any of printing ink and dampening water on a printing machine after exposure and contains (A) an infrared absorbing dye, (B) a polymerization initiator, (C) a polymerizable compound and (D) a binder polymer having an alkylene oxide group. The image-recording layer capable of undergoing on-press development according to the invention preferably further contains (G) a hydrophobilizing precursor.

Hereinafter, each component capable of being incorporated into the image-recording layer will be described in order.

(D) Binder Polymer Having Alkylene Oxide Group

The binder polymer having an alkylene oxide group for use in the lithographic printing plate precursor according to the invention may have a poly(alkylene oxide) moiety in the main chain thereof or the side chain thereof, or may be a graft polymer having a poly(alkylene oxide) in its side chain or a block copolymer composed of a block constituted by a repeating unit containing a poly(alkylene oxide) and a block constituted by a repeating unit not containing an (alkylene oxide).

In the case where the alkylene oxide group is present in the main chain, the binder polymer is preferably a polyurethane resin. In the case where the alkylene oxide group is present in the side chain, a polymer constituting its main chain includes an acrylic resin, a polyvinyl acetal resin, a polyurethane resin, a polyurea resin, a polyimide resin, a polyamide resin, an epoxy resin, a methacrylic resin, a polystyrene resin, a novolac type phenolic resin, a polyester resin, a synthesis rubber and a natural rubber. In particular, an acrylic resin is preferred.

The alkylene oxide is preferably an alkylene oxide having from 2 to 6 carbon atoms, and particularly preferably an ethylene oxide or a propylene oxide.

A repeating number of alkylene oxide in the poly(alkylene oxide) moiety is ordinarily from 2 to 120, preferably from 2 to 70, and more preferably from 2 to 50.

It is preferred that the repeating number of alkylene oxide is 120 or less because both the deterioration of printing durability due to abrasion and the deterioration of printing durability due to decrease in the ink receptivity are prevented.

The poly(alkylene oxide) moiety is preferably introduced into an side chain of the binder as a structure represented by formula (4) shown below. More preferably, it is introduced into a side chain of an acrylic resin as a structure represented by formula (4) shown below.

Formula (4):

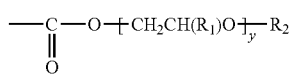

In formula (4), y represents a number from 2 to 120, preferably from 2 to 70, and more preferably from 2 to 50. $R_1$ represents a hydrogen atom or an alkyl group. $R_2$ represents a hydrogen atom or an organic group. The organic group is preferably an alkyl group having from 1 to 6 carbon atoms and includes a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, a 1,1-dimethylbutyl group, a 2,2-dimethylbutyl group, a cyclopentyl group and a cyclohexyl group.

In formula (4), $R_1$ is preferably a hydrogen atom or a methyl group and most preferably a hydrogen atom. $R_2$ is most preferably a hydrogen atom or a methyl group.

The binder polymer may have a crosslinking property in order to improve the film strength of the image area. In order to impart the crosslinking property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include —$(CH_2)_n$CR$^1$=CR$^2$R$^3$, —$(CH_2O)_n$CH$_2$CR$^1$=CR$^2$R$^3$, —$(CH_2CH_2O)_n$CH$_2$CR$^1$=CR$^2$R$^3$, —$(CH_2)_n$NH—CO—O—CH$_2$CR$^1$=CR$^2$R$^3$, —$(CH_2)_n$—O—CO—CR$^1$=CR$^2$R$^3$ and —$(CH_2CH_2O)_2$—X (wherein R$^1$ to R$^3$ each represents a hydrogen atom, a halogen atom or an alkyl group having from 1 to 20 carbon atoms, an aryl group, alkoxy group or aryloxy group, or R$^1$ and R$^2$ or R$^1$ and R$^3$ may be combined with each other to form a ring. n represents an integer from 1 to 10. X represents a dicyclopentadienyl residue).

Specific examples of the ester residue include —CH$_2$CH=CH$_2$ (described in JP-B-7-21633 (the ten "JP-B" as used herein means an "examined Japanese patent publication")), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NH-COO—CH$_2$CH=CH$_2$ and —CH$_2$CH$_2$O—X (wherein X represents a dicyclopentadienyl residue).

Specific examples of the amide residue include —CH$_2$CH=CH$_2$, —CH$_2$CH$_2$—Y (wherein Y represents a cyclohexene residue) and —CH$_2$CH$_2$—OCO—CH=CH$_2$.

The binder polymer having crosslinkable property is cured, for example, by addition of a free radical (a polymerization initiating radical or a growing radical of a polymerizable compound in the process of polymerization) to the crosslinkable functional group of the polymer and undergoing addition polymerization between the polymers directly or through a polymerization chain of the polymerizable compound to form crosslinkage between the polymer molecules. Alternately, it is cured by generation of a polymer radical upon extraction of an atom (for example, a hydrogen atom on a carbon atom adjacent to the functional crosslinkable group) in the polymer by a free radical and connecting the polymer radicals with each other to form cross-linkage between the polymer molecules.

The content of the crosslinkable group (content of the radical polymerizable unsaturated double bond determined by iodine titration) in the binder polymer is preferably from 0.1 to 10.0 mmol, more preferably from 1.0 to 7.0 mmol, most preferably from 2.0 to 5.5 mmol, based on 1 g of the binder polymer. In the range described above, good sensitivity and good preservation stability can be obtained.

Specific examples (1) to (11) of the binder polymer for use in the invention are set forth below, but the invention should not be construed as being limited thereto.

In the following specific examples, the numbers recited with each of the repeating units (the numbers recited with the repeating units of the main chain) are mol percentages, and the numbers recited with the repeating units in the side chain are the number of replication of the repeating site.

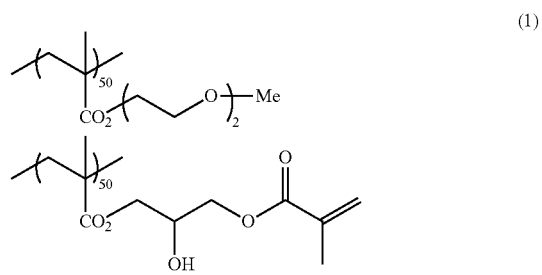

(1)

(2)

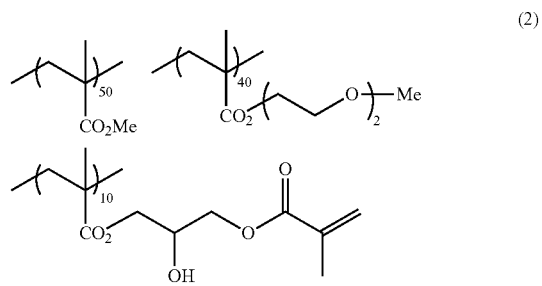

(3)

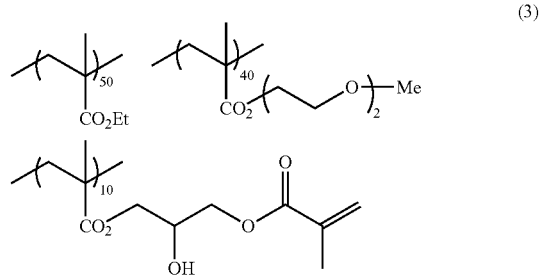

(4)

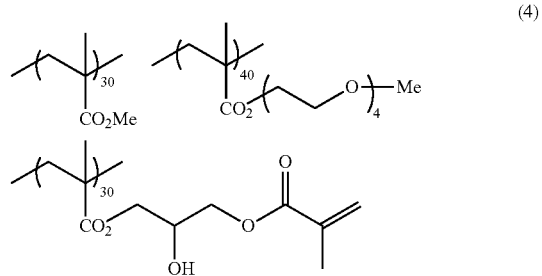

(5)

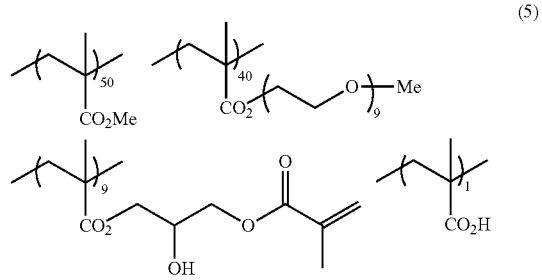

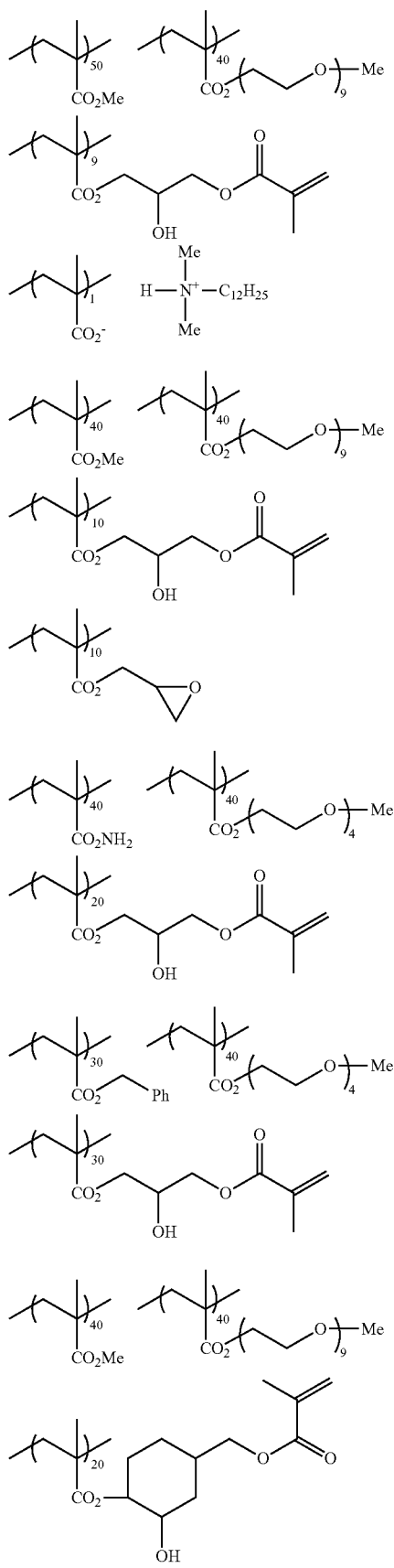

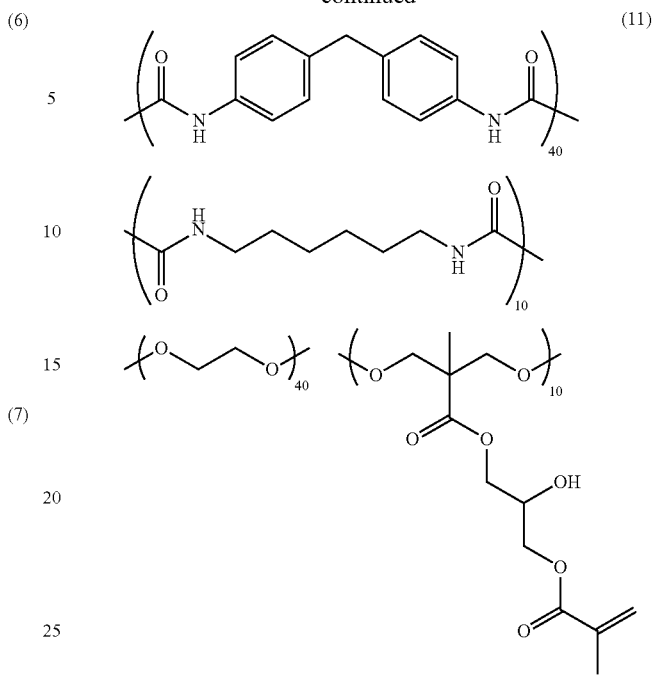

The weight average molecular weight (Mw) of the binder polymer according to the invention is preferably 2,000 or more, more preferably 5,000 or more, and still more preferably from 10,000 to 300,000.

According to the invention, a hydrophilic polymer compound, for example, polyacrylic acid or polyvinyl alcohol described in JP-A-2008-195018 may be used together, if desired. Further, an oleophilic polymer compound may be used in combination with a hydrophilic polymer compound.

As for the configuration of the binder polymer according to the invention, it may be present as a binder acting as a bond of each ingredient or in the form of fine particle in the image-recording layer. In the case of existing in the form of fine particle, the average particle size thereof is ordinarily in a range from 10 to 1,000 nm, preferably in a range from 20 to 300 nm, and particularly preferably in a range from 30 to 120 nm.

The content of the binder polymer according to the invention is preferably from 5 to 90% by weight, more preferably from 5 to 80% by weight, still more preferably from 10 to 70% by weight, based on the total solid content of the image-recording layer.

(A) Infrared Absorbing Dye

The infrared absorbing dye has a function of converting the infrared ray absorbed to heat and a function of being excited by the infrared ray to perform electron transfer and/or energy transfer to a polymerization initiator described hereinafter. The infrared absorbing dye for use in the invention includes a dye having an absorption maximum in a wavelength range from 760 to 1,200 nm.

As the dye, commercially available dyes and known dyes described in literatures, for example, *Senryo Binran* (*Dye Handbook*) compiled by The Society of Synthetic Organic Chemistry, Japan (1970) can be used. Specifically, the dye includes an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt and a metal thiolate complex.

Of the dyes, a cyanine dye, a squarylium dye, a pyrylium salt, a nickel thiolate complex or an indolenine cyanine dye is particularly preferred. A cyanine dye or an indolenine cyanine dye is more preferred. As a particularly preferred example of the dye, a cyanine dye represented by formula (a) shown below is exemplified.

Formula (a):

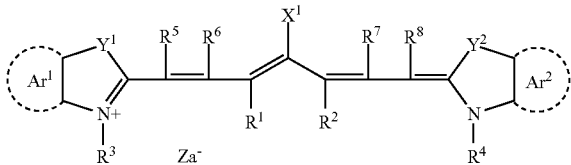

In formula (a), $X^1$ represents a hydrogen atom, a halogen atom, $-N(R^9)(R^{10})$, $-X^2-L^1$ or a group shown below. $R^9$ and $R^{10}$, which may be the same or different, each represents an aromatic hydrocarbon group having from 6 to 10 carbon atoms which may have a substituent, an alkyl group having from 1 to 8 carbon atoms which may have a substituent or a hydrogen atom, or $R^9$ and $R^{10}$ may be combined with each other to form a ring. $R^9$ and $R^{10}$ each preferably represents a phenyl group. $X^2$ represents an oxygen atom or a sulfur atom. $L^1$ represents a hydrocarbon group having from 1 to 12 carbon atoms, an aromatic ring containing a hetero atom or a hydrocarbon group having from 1 to 12 carbon atoms and containing a hetero atom. The hetero atom used herein indicates a nitrogen atom, a sulfur atom, an oxygen atom, a halogen atom or a selenium atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

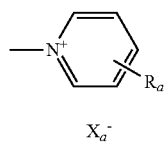

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. Alternatively, $R^1$ and $R^2$ may be combined with each other to form a ring and in the case of forming a ring, it is particularly preferred that $R^1$ and $R^2$ are combined with each other to form a 5-membered or 6-membered ring.

$Ar^1$ and $Ar^2$, which may be the same or different, each represents an aryl group which may have a substituent. Preferred examples of the aryl group include a benzene ring group and a naphthalene ring group. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. Preferred examples of the counter ion for $Za^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of a coating solution for image-recording layer.

Specific examples of the cyanine dye represented by formula (i), which can be preferably used in the invention, include compounds described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and most preferably compounds described in Paragraph Nos. [0035] to [0043] of JP-A-2007-90850.

Also, compounds described in Paragraph Nos. [0008] to [0009] of JP-A-5-5005 and Paragraph Nos. [0022] to [0025] of JP-A-2001-222101 are preferably used.

The infrared absorbing dyes (A) may be used only one kind or in combination of two or more kinds thereof and it may also be used together with an infrared absorbing agent other than the infrared absorbing dye, for example, a pigment. As the pigment, compounds described in Paragraph Nos. [0072] to [0076] of JP-A-2008-195018 are preferred.

The content of the infrared absorbing dye in the image-recording layer according to the invention is preferably from 0.1 to 10.0% by weight, more preferably from 0.5 to 5.0% by weight, based on the total solid content of the image-recording layer.

(B) Polymerization Initiator

The polymerization initiator (B) for use in the invention is a compound which initiates or accelerates polymerization of a polymerizable compound (C). The polymerization initiator for use in the invention is preferably a radical polymerization initiator and includes, for example, a known thermal polymerization initiator, a compound containing a bond having small bond dissociation energy and a photopolymerization initiator.

The polymerization initiator used in the invention includes, for example, (a) an organic halide, (b) a carbonyl compound, (c) an azo compound, (d) an organic peroxide, (e) a metallocene compound, (f) an azido compound, (g) a hexaarylbiimidazole compound, (h) an organic borate compound, (i) a disulfone compound, (j) an oxime ester compound and (k) an onium salt compound.

As the organic halide (a), compounds described in Paragraph Nos. [0022] to [0023] of JP-A-2008-195018 are preferred.

As the carbonyl compound (b), compounds described in Paragraph No. [0024] of JP-A-2008-195018 are preferred.

As the azo compound (c), for example, azo compounds described in JP-A-8-108621 are used.

As the organic peroxide (d), for example, compounds described in Paragraph No. [0025] of JP-A-2008-195018 are preferred.

As the metallocene compound (e), for example, compounds described in Paragraph No. [0026] of JP-A-2008-195018 are preferred.

As the azido compound (f), compound, for example, 2,6-bis(4-azidobenzylidene)-4-methylcyclohexanone is exemplified.

As the hexaarylbiimidazole compound (g), for example, compounds described in Paragraph No. [0027] of JP-A-2008-195018 are preferred.

As the organic borate compound (h), for example, compounds described in Paragraph No. [0028] of JP-A-2008-195018 are preferred.

As the disulfone compound (i), for example, compounds described in JP-A-61-166544 and JP-A-2002-328465 are exemplified.

As the oxime ester compound (j), for example, compounds described in Paragraph Nos. [0028] to [0030] of JP-A-2008-195018 are preferred.

As the onium salt compound (k), onium salts, for example, diazonium salts described in S. I. Schlesinger, *Photogr. Sci. Eng.*, 18, 387 (1974), T. S. Bal et al., *Polymer*, 21, 423 (1980) and JP-A-5-158230, ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Publication No. 2008/0311520, JP-A-2-150848, JP-A-2008-195018 and J. V. Crivello et al., *Macromolecules*, 10 (6), 1307 (1977), sulfonium salts described in European Patents 370, 693, 233,567, 297,443 and 297,442, U.S. Pat. Nos. 4,933, 377, 4,760,013, 4,734,444 and 2,833,827, German Patents 2,904,626, 3,604,580 and 3,604,581, selenonium salts described in J. V. Crivello et al., *J. Polymer Sci., Polymer Chem. Ed.*, 17, 1047 (1979), arsonium salts described in C. S. Wen et al., *Teh, Proc. Conf. Rad. Curing ASIA*, p. 478, Tokyo, October (1988), and azinium salts described in JP-A-2008-195018 are exemplified.

Of the polymerization initiators, the onium salt, particularly, the iodonium salt, sulfonium salt or azinium salt is more preferred. Specific examples of these compounds are set forth below, but the invention should not be construed as being limited thereto.

Of the iodonium salts, diphenyliodonium salts are preferred, diphenyliodonium salts substituted with an electron donating group, for example, an alkyl group or an alkoxy group are more preferred, and asymmetric diphenyliodonium salts are still more preferred. Specific examples thereof include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate, tris(4-chlorophenyl)sulfonium 3,5-bis(methoxycarbonyl)benzenesulfonate and tris(4-chlorophenyl)sulfonium hexafluorophosphate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The polymerization initiator according to the invention can be added to the image-recording layer preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(C) Polymerizable Compound

The polymerizable compound for use in the image-recording layer according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof.

Examples of the monomer include unsaturated carboxylic acids (for example, acrylic acid, methacrylic acid, itaconic acid, crotonic acid, isocrotonic acid or maleic acid) and esters or amides thereof Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380, JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis [p-(3-methacryloxy-2-hydroxypropoxy) phenyl]dimethylmethane and bis[p-(methacryloxyethoxy) phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \qquad (A)$$

wherein $R_4$ and $R_5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Of the compounds described above, an isocyanuric acid ethyleneoxide-modified acrylate, for example, tris(acryloyloxyethyl)isocyanurate or bis(acryloyloxyethyl)hydroxyethyl isocyanurate is particularly preferred from the standpoint of excellent balance between hydrophilicity relating to the on-press development property and polymerization ability relating to the printing durability.

Details of the method of using the polymerizable compound, for example, selection of the structure, individual or combination use or an amount added, can be appropriately determined in accordance with the characteristic design of the final lithographic printing plate precursor. The polymerizable compound is used preferably in a range from 5 to 75% by weight, more preferably in a range from 10 to 70% by weight, particularly preferably in a range from 15 to 60% by weight, based on the total solid content of the image-recording layer.

(G) Hydrophobilizing Precursor

According to the invention, a hydrophobilizing precursor can be used in order to improve the on-press development property. The hydrophobilizing precursor for use in the invention is a fine particle capable of converting the image-recording layer to be hydrophobic when heat is applied. The fine particle is preferably at least one fine particle selected from hydrophobic thermoplastic polymer fine particle, thermo-reactive polymer fine particle, polymer fine particle having a polymerizable group, microcapsule having a hydrophobic compound encapsulated and microgel (crosslinked polymer fine particle). Among them, polymer fine particle having a polymerizable group and microgel are preferred.

As the hydrophobic thermoplastic polymer fine particle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile and polymethyl methacrylate are more preferred.

The average particle size of the hydrophobic thermoplastic polymer fine particle for use in the invention is preferably from 0.01 to 2.0 μm.

The thermo-reactive polymer fine particle for use in the invention includes polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, although a functional group performing any reaction can be used as long as a chemical bond is formed, a polymerizable group is preferred. For instance, an ethylenically unsaturated group (for example, an acryloyl group, a methacryloyl group, a vinyl group or an allyl group) performing a radical polymerization reaction, a cationic polymerizable group (for example, a vinyl group, a vinyloxy group, an epoxy group or an oxetanyl group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsules. It is a more preferable embodiment of the image-recording layer containing microcapsules that hydrophobic constituting components are encapsulated in microcapsules and hydrophilic components are present outside the microcapsules.

The image-recording layer according to the invention may be an embodiment containing a crosslinked resin particle, that is, a microgel. The microgel can contain a part of the constituting components of the image-recording layer at least one of in the inside and on the surface thereof. Particularly, an embodiment of a reactive microgel containing a radical polymerizable group on the surface thereof is preferred in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time lapse stability can be achieved.

The content of the hydrophobilizing precursor is preferably in a range from 5 to 90% by weight based on the total solid content of the image-recording layer.

(H) Other Components

The image-recording layer according to the invention may further contain other components, if desired.

(1) Hydrophilic Low Molecular Weight Compound

The image-recording layer according to the invention may contain a hydrophilic low molecular weight compound in order to improve the on-press development property without accompanying the decrease in the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyol compound, e.g., glycerine, pentaerythritol or tris(2-hydroxyethyl)isocyanurate, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

According to the invention, it is preferred to incorporate at least one compound selected from a polyol compound, an organic sulfate compound, an organic sulfonate compound and a betaine compound into the image-recording layer.

Specific examples of the organic sulfonate compound include an alkylsulfonate, for example, sodium n-butylsulfonate, sodium n-hexylsulfonate, sodium 2-ethyihexylsulfonate, sodium cyclohexylsulfonate or sodium n-octylsulfonate; an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate; an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphthalenedisulfonate or nisodium 1,3,6-naphthalenetrisulfonate, and compounds described in Paragraph Nos. [0026] to [0031] of JP-A-2007-276454 and Paragraph Nos. [0020] to [0047] of JP-A-2009-154525. The salt may also be potassium salt or lithium salt.

The organic sulfate compound includes a sulfate of alkyl, alkenyl, alkynyl, aryl or heterocyclic monoether of polyethylene oxide. The number of ethylene oxide unit is preferably from 1 to 4. The salt is preferably a sodium salt, a potassium salt or a lithium salt. Specific examples thereof include compounds described in Paragraph Nos. [0034] to [0038] of JP-A-2007-276454.

As the betaine compound, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-ppidinio)butyrate, 1-hydroxyethyl-1-imidazolioacetate, trimethylammonium methanesulfonate, dimethylpropylammonium methanesulfonate, 3-trimethylammonio-1-poipanesulfonate and 3-(1-pyridinio)-1-porpanesulfonate.

Since the hydrophilic low molecular weight compound has a small structure of hydrophobic portion and almost no surface active function, degradations of the hydrophobicity and film strength in the image area due to penetration of dampening water into the exposed area (image area) of the image-recording layer are prevented and thus, the ink receptive-property and printing durability of the image-recording layer can be preferably maintained.

The amount of the hydrophilic low molecular weight compound added to the image-recording layer is preferably from 0.5 to 20% by weight, more preferably from 1 to 15% by weight, still more preferably from 2 to 10% by weight, based on the total solid content of the image-recording layer. In the range described above, good on-press development property and printing durability are obtained.

The hydrophilic low molecular weight compounds may be used individually or as a mixture of two or more thereof.

(2) Oil-Sensitizing Agent

In order to improve the ink-receptive property, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into a protective layer, the oil-sensitizing agent functions as a surface covering agent of the inorganic stratiform compound and prevents deterioration of the ink-receptive property during printing due to the inorganic stratiform compound.

As preferable examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio)heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate, benzyldimethyldodecylammonium hexafluorophosphate and compounds described in Paragraph Nos. [0021] to [0037] of JP-A-2008-284858 and Paragraph Nos. [0030] to [0057] of JP-A-2009-90645.

The ammonium group-containing polymer may be any polymer containing an ammonium group in its structure and is preferably a polymer containing from 5 to 80% by mole of (meth)acrylate having an ammonium group in its side chain as a copolymerization component. Specific examples thereof include polymers described in Paragraph Nos. [0089] to [0105] of JP-A-2009-208458.

As to the ammonium group-containing polymer, its reduced specific viscosity value (unit: mug) determined according to the measuring method described below is preferably from 5 to 120, more preferably from 10 to 110, particularly preferably from 15 to 100. When the reduced specific viscosity value described above is calculated in terms of weight average molecular weight (Mw), from 10,000 to 150,000 is preferred, from 17,000 to 140,000 is more preferred, and 20,000 to 130,000 is particularly preferred.

<Measuring Method of Reduced Specific Viscosity>

In a 20 ml measuring flask was weighed 1.0 g of polymer and the measuring flask was filled up to the gauge line with N-methyl pyrrolidone. The resulting solution was allowed to stand in a thermostatic bath of 30° C. for 30 minutes and put into an Ubbelohde viscometer (viscometer constant: 0.010 cSt/s) and a period for running down of the solution at 30° C. was measured. The measurement was conducted twice for the same sample and an average value of the measurement was determined. The measurement was also conducted for a blank (only N-methyl pyrrolidone) in the same manner. The reduced specific viscosity was calculated according to the formula shown below.

$$\text{Reduced specific viscosity (ml/g)} = \frac{\dfrac{\text{Period for running down of sample solution (sec)} -}{\text{Period for running down of blank (sec)}}}{3.33\ (g) \times \dfrac{30}{100}}$$

$$\overline{20\ (ml)}$$

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90, Mw: 45,000)
(2) 2-(Trimethylammonio)ethyl methacrylate hexafluorophosphate/3,6-dioxaheptyl methacrylate copolymer (molar ratio: 20/80, Mw: 60,000)
(3) 2-(Ethyldimethylammonio)ethyl methacrylate p-toluenesulfonate/hexyl methacrylate copolymer (molar ratio: 30/70, Mw: 45,000)
(4) 2-(Trimethylammonio)ethyl methacrylate hexafluorophosphate/2-ethylhexyl methacrylate copolymer (molar ratio: 20/80, Mw: 60,000)
(5) 2-(Trimethylammonio)ethyl methacrylate methylsulfate/hexyl methacrylate copolymer (molar ratio: 40/60, Mw: 70,000)
(6) 2-(Butyldimethylammonio)ethyl methacrylate hexafluorophosphate/3,6-dioxaheptyl methacrylate copolymer (molar ratio: 25/75, Mw: 65,000)
(7) 2-(Butyldimethylammonio)ethyl acrylate hexafluorophosphate/3,6-dioxaheptyl methacrylate copolymer (molar ratio: 20/80, Mw: 65,000)
(8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80, Mw: 75,000)
(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5, Mw: 65,000)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(3) Other Components

Other components, for example, a surfactant, a coloring agent, a print-out agent, a polymerization inhibitor, a higher fatty acid derivative, a plasticizer, an inorganic fine particle, an inorganic stratiform compound, a co-sensitizer or a chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

(I) Formation of Image-Recording Layer

The image-recording layer according to the invention is formed by dispersing or dissolving each of the necessary constituting components described above in a solvent to prepare a coating solution and coating the solution on a support by a known method, for example, bar coater coating and drying as described in Paragraph Nos. [0142] to [0143] of JP-A-2008-195018. The coating amount (solid content) of the image-recording layer formed on a support after coating and drying may be varied according to the intended purpose but is in general preferably from 0.3 to 3.0 g/m$^2$. In the range described above, good sensitivity and good film property of the image-recording layer can be obtained.

(Undercoat Layer)

In the lithographic printing plate precursor according to the invention, an undercoat layer (also referred to as an intermediate layer) is preferably provided between the image-recording layer and the support. The undercoat layer strengthens adhesion between the support and the image-recording layer in the exposed area and makes removal of the image-recording layer from the support easy in the unexposed area, thereby contributing improvement in the developing property without accompanying degradation of the printing durability. Further, it is advantageous that in the case of infrared laser exposure, since the undercoat layer acts as a heat insulating layer, decrease in sensitivity due to diffusion of heat generated upon the exposure into the support is prevented.

As the compound for use in the undercoat layer, a compound having an adsorbing group capable of adsorbing to a surface of support and a crosslinkable group for improving an adhesion property to the image-recording layer is preferred. Further, a compound having a hydrophilicity-imparting group, for example, a sulfo group is also exemplified as a preferable compound. The compound may be a low molecular weight compound or a polymer compound. The compounds may be used in mixture of two or more thereof, if desired.

As the polymer compound, a copolymer of a monomer having an adsorbing group, a monomer having a hydrophilic group and a monomer having a crosslinkable group is preferred. As the adsorbing group capable of adsorbing to a surface of support, a phenolic hydroxy group, a carboxyl group, —PO$_3$H$_2$, —OPO$_3$H$_2$, —CONHSO$_2$—, —SO$_2$NHSO$_2$— or —COCH$_2$COCH$_3$ is preferred. As the hydrophilic group, a sulfo group is preferred. As the crosslinkable group, for example, a methacryl group or an allyl group is preferred. The polymer compound may contain a crosslinkable group introduced by a salt formation between a polar substituent of the polymer compound and a compound containing a substituent having a counter charge to the polar substituent of the polymer compound and an ethylenically unsaturated bond and also may be further copolymerized with a monomer other than those described above, preferably a hydrophilic monomer.

Specifically, a silane coupling agent having an addition-polymerizable ethylenic double bond reactive group described in JP-A-10-282679 and a phosphorus compound having an ethylenic double bond reactive group described in JP-A-2-304441 are preferably exemplified. Low molecular weight compounds or polymer compounds having a crosslinkable group (preferably an ethylenically unsaturated bond group), a functional group capable of interacting with a surface of support and a hydrophilic group described in JP-A-

2005-238816, JP-A-2005-125749, JP-A-2006-239867 and JP-A-2006-215263 are also preferably used.

Polymer compounds having an adsorbing group capable of adsorbing to a surface of support, a hydrophilic group and a crosslinkable group described in JP-A-2005-125749 and JP-A-2006-188038 are more preferred.

The content of the unsaturated double bond in the polymer compound for undercoat layer is preferably from 0.1 to 10.0 mmol, most preferably from 0.2 to 5.5 mmol, based on 1 g of the polymer compound.

The weight average molecular weight of the polymer compound for undercoat layer is preferably 5,000 or more, and more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with a surface of aluminum support (for example, 1,4-diazabicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the compound for the undercoat layer described above in order to prevent the occurrence of stain due to preservation of the lithographic printing plate precursor.

The undercoat layer is coated according to a known method. The coating amount (solid content) of the undercoat layer is preferably from 0.1 to 100 mg/m$^2$, and more preferably from 1 to 30 mg/m$^2$.

(Support)

As the support for use in the lithographic printing plate precursor according to the invention, a known support is used. Particularly, an aluminum plate subjected to roughening treatment and anodizing treatment according to a known method is preferred.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness from 0.10 to 1.2 μm.

The support according to the invention may have a backcoat layer containing an organic polymer compound described in JP-A-5-45885 or an alkoxy compound of silicon described in JP-A-6-35174, provided on the back surface thereof, if desired.

[Plate Making Method]

Plate making of the lithographic printing plate precursor according to the invention is preferably performed by an on-press development method. The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the lithographic printing plate precursor is removed in the course of the printing step. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing step. Then, the printing operation is initiated using the printing machine with supplying oily ink and an aqueous component and at an early stage in the course of the printing the on-press development is carried out. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

The plate making method is described in more detail below.

As the light source used for the image exposure in the invention, a laser is preferred. The laser for use in the invention is not particularly restricted and preferably includes, for example, a solid laser or semiconductor laser emitting an infrared ray having a wavelength from 760 to 1,200 nm.

With respect to the infrared ray laser, the output is preferably 100 mW or more, the exposure time per pixel is preferably within 20 microseconds, and the irradiation energy is preferably from 10 to 300 mJ/cm$^2$. With respect to the laser exposure, in order to shorten the exposure time, it is preferred to use a multibeam laser device.

The exposed lithographic printing plate precursor is mounted on a plate cylinder of a printing machine. In the case of using a printing machine equipped with a laser exposure apparatus, the lithographic printing plate precursor is mounted on a plate cylinder of the printing machine and then subjected to the imagewise exposure.

When dampening water and printing ink are supplied to the imagewise exposed lithographic printing plate precursor to perform printing, in the exposed area of the image-recording layer, the image-recording layer cured by the exposure forms the printing ink receptive area having the oleophilic surface. On the other hand, in the unexposed area, the uncured image-recording layer is removed by dissolution or dispersion with the dampening water and/or printing ink supplied to reveal the hydrophilic surface in the area. As a result, the dampening water adheres onto the revealed hydrophilic surface and the printing ink adheres onto the exposed area of the image-recording layer, whereby printing is initiated.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor according to the invention is subjected to the on-press development on an offset printing machine and used as it is for printing a large number of sheets.

EXAMPLES

The present invention will be described in more detail with reference to the following examples, but the invention should not be construed as being limited thereto. With respect to the polymer compounds used in the examples, unless otherwise particularly defined, a molecular weight means a weight average molecular weight (Mw) and a ratio of repeating unit is indicated in mole percent.

Synthesis Example of Hydrophilic Polymer (Synthesis Example of Hydrophilic Polymer 1)

A stirrer, a thermometer, a dropping funnel, a nitrogen inlet tube and a reflux condenser were attached to a 500 ml four-neck flask and while carrying out deoxygenation by introduction of nitrogen gas, 61 g of methanol and 15 g of water were charged therein and the flask was heated until the internal temperature reached 60° C. Separately, Dropping solution 1 composed of 46 g of methanol, 11 g of water, 57 g of acrylamide (produced by Wako Pure Chemical Industries, Ltd.) and 20 g of ethyl acrylate and Dropping solution 2 composed of 46 g of methanol, 11 g of water and 4.825 g of a polymerization initiator (VA-046B, produced by Wako Pure Chemical Industries, Ltd.) were prepared at room temperature. Then, Dropping solution 1 and Dropping solution 2 were added dropwise to the flask over a period of 2 hours. After the completion of the dropwise addition, the reaction was continued as it was for 2 hours. Further, 2.413 g of the polymerization initiator (VA-046B, produced by Wako Pure Chemical Industries, Ltd.) was added to the reaction solution and the reaction was continued for 2 hours. Finally, the reaction solution was cooled to room temperature to obtain Hydrophilic polymer 1.

(Synthesis Example of Hydrophilic Polymer 3)

A stirrer, a thermometer, a dropping funnel, a nitrogen inlet tube and a reflux condenser were attached to a 500 ml four-neck flask and while carrying out deoxygenation by introduction of nitrogen gas, 62 g of methanol and 26 g of water were charged therein and the flask was heated until the internal temperature reached 60° C. Separately, Dropping solution 1 composed of 46 g of methanol, 20 g of water, 57 g of acrylamide (produced by Wako Pure Chemical Industries, Ltd.) and 26 g of n-butyl acrylate and Dropping solution 2 composed of 46 g of methanol, 20 g of water and 4.825 g of a polymerization initiator (VA-046B, produced by Wako Pure Chemical Industries, Ltd.) were prepared at room temperature. Then, Dropping solution 1 and Dropping solution 2 were added dropwise to the flask over a period of 2 hours. After the completion of the dropwise addition, the reaction was continued as it was for 2 hours. Further, 2.413 g of the polymerization initiator (VA-046B, produced by Wako Pure Chemical Industries, Ltd.) was added to the reaction solution and the reaction was continued for 2 hours. Finally, the reaction solution was cooled to room temperature to obtain Hydrophilic polymer 3.

(Synthesis Example of Hydrophilic Polymer 4)

A stirrer, a thermometer, a dropping funnel, a nitrogen inlet tube and a reflux condenser were attached to a 500 ml four-neck flask and while carrying out deoxygenation by introduction of nitrogen gas, 62 g of methanol and 26 g of water were charged therein and the flask was heated until the internal temperature reached 60° C. Separately, Dropping solution 1 composed of 46 g of methanol, 20 g of water, 57 g of acrylamide (produced by Wako Pure Chemical Industries, Ltd.) and 26 g of isobutyl acrylate and Dropping solution 2 composed of 46 g of methanol, 20 g of water and 4.825 g of a polymerization initiator (VA-046B, produced by Wako Pure Chemical Industries, Ltd.) were prepared at room temperature. Then, Dropping solution 1 and Dropping solution 2 were added dropwise to the flask over a period of 2 hours. After the completion of the dropwise addition, the reaction was continued as it was for 2 hours. Further, 2.413 g of the polymerization initiator (VA-046B, produced by Wako Pure Chemical Industries, Ltd.) was added to the reaction solution and the reaction was continued for 2 hours. Finally, the reaction solution was cooled to room temperature to obtain Hydrophilic polymer 4.

(Synthesis Example of Hydrophilic Polymer 5)

A stirrer, a thermometer, a dropping funnel, a nitrogen inlet tube and a reflux condenser were attached to a 500 ml four-neck flask and while carrying out deoxygenation by introduction of nitrogen gas, 62 g of methanol and 26 g of water were charged therein and the flask was heated until the internal temperature reached 60° C. Separately, Dropping solution 1 composed of 46 g of methanol, 20 g of water, 57 g of acrylamide (produced by Wako Pure Chemical Industries, Ltd.) and 26 g of tert-butyl acrylate and Dropping solution 2 composed of 46 g of methanol, 20 g of water and 4.825 g of a polymerization initiator (VA-046B, produced by Wako Pure Chemical Industries, Ltd.) were prepared at room temperature. Then, Dropping solution 1 and Dropping solution 2 were added dropwise to the flask over a period of 2 hours. After the completion of the dropwise addition, the reaction was continued as it was for 2 hours. Further, 2.413 g of the polymerization initiator (VA-046B, produced by Wako Pure Chemical Industries, Ltd.) was added to the reaction solution and the reaction was continued for 2 hours. Finally, the reaction solution was cooled to room temperature to obtain Hydrophilic polymer 5.

Examples 1 to 151 and Comparative Examples 1 to 23

[1] Preparation of Lithographic Printing Plate Precursors (1) to (174)

(1) Preparation of Support

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and then washed with water to obtain Support (2). The adhesion amount of Si was 10 mg/m². The center line average roughness (Ra) of the support was measured using a stylus having a diameter of 2 μm and found to be 0.51 μm.

(2) Formation of Undercoat Layer

Coating solution (1) for undercoat layer shown below was coated on Support (2) so as to have a dry coating amount of 20 mg/m² to prepare a support having an undercoat layer.

<Coating Solution (1) for Undercoat Layer>

| | |
|---|---|
| Compound (1) for undercoat layer having structure shown below | 0.18 g |
| Hydroxyethyliminodiacetic acid | 0.10 g |
| Methanol | 55.24 g |
| Water | 6.15 g |

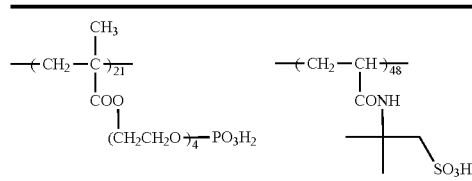

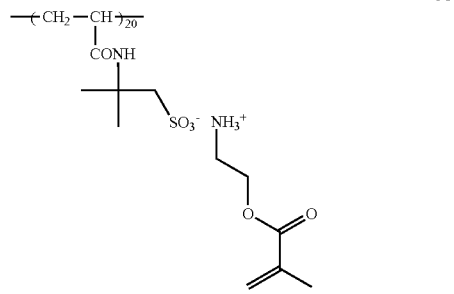

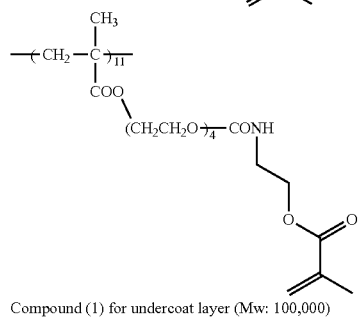

Compound (1) for undercoat layer (Mw: 100,000)

(3) Formation of Image-Recording Layer

Coating solution (1) for image-recording layer having the composition shown below was coated on the undercoat layer described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive Solution (1)>

| | |
|---|---|
| Binder polymer (2) having structure shown below | 0.240 g |
| Infrared absorbing dye (1) having structure shown below | 0.030 g |
| Polymerization initiator (1) having structure shown below | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium PF$_6$ salt) | 0.018 g |
| Oil-sensitizing agent (Ammonium group-containing polymer having structure shown below (reduced specific viscosity: 44 cSt/g/ml) | 0.035 g |
| Fluorine-based surfactant (1) having structure shown below | 0.008 g |
| 2-Butanone | 1.091 g |
| 1-Methoxy-2-propanol | 8.609 g |

<Microgel Solution (1)>

| | |
|---|---|
| Microgel (1) shown below | 2.640 g |
| Distilled water | 2.425 g |

The structures of Binder polymer (2), Infrared absorbing dye (1), Polymerization initiator (1), Phosphonium compound (1), Hydrophilic low molecular weight compound (1), Oil-sensitizing agent (ammonium group-containing polymer) and Fluorine-based surfactant (1) are shown below.

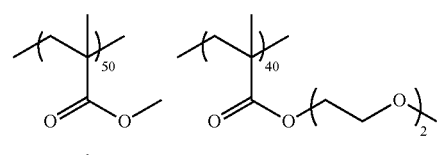

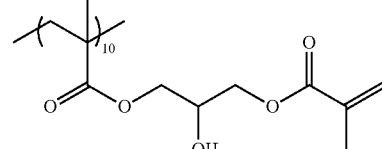

Binder polymer (2) (Me: 70,000)

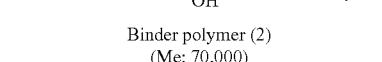

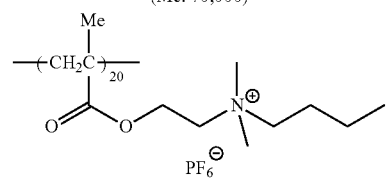

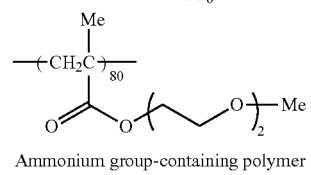

Ammonium group-containing polymer

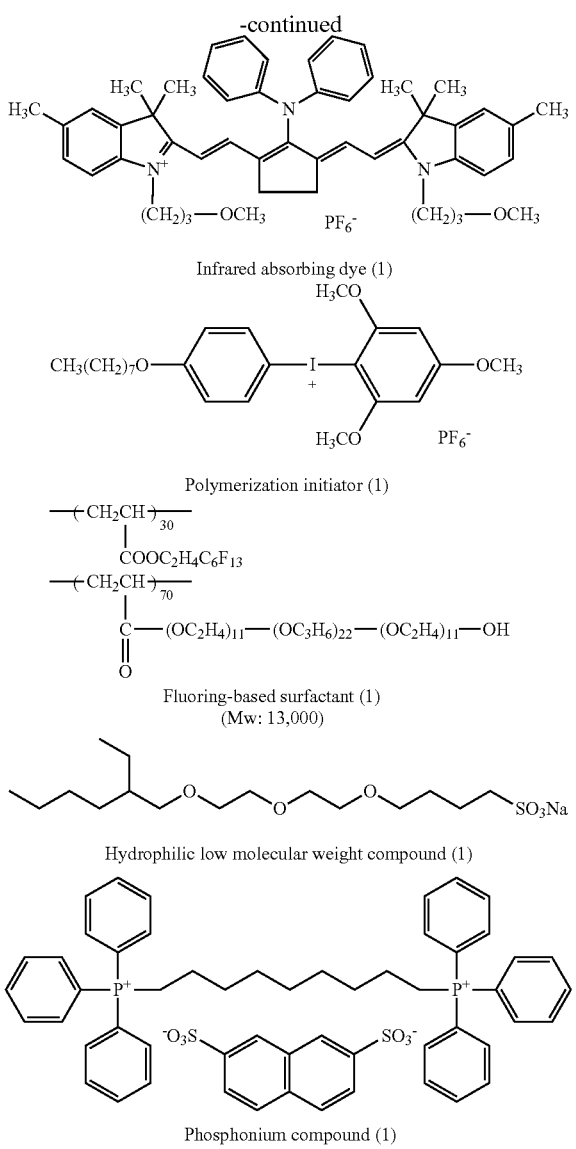

Infrared absorbing dye (1)

Polymerization initiator (1)

Fluoring-based surfactant (1)
(Mw: 13,000)

Hydrophilic low molecular weight compound (1)

Phosphonium compound (1)

<Preparation of Microgel (1)>

An oil phase component was prepared by dissolving 10 g of adduct of trimethylol propane and xylene diisocyanate (TAKENATE D-110N, produced by Mitsui Chemicals Polyurethanes, Inc.), 3.15 g of pentaerythritol triacrylate (SR444, produced by Nippon Kayaku Co., Ltd.) and 0.1 g of PIONIN A-41C (produced by Takemoto Oil & Fat Co., Ltd.) in 17 g of ethyl acetate. As an aqueous phase component, 40 g of a 4% by weight aqueous solution of polyvinyl alcohol (PVA-205, produced by Kuraray Co., Ltd.) was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (1). The average particle size of the microgel was measured by a light scattering method and found to be 0.2 μm.

(4) Formation of Protective Layer

Coating solution (1) for protective layer having the composition shown below was coated on the image-recording layer described above by a bar and dried in an oven at 120° C. for 60 seconds to form a protective layer having a dry coating amount of 0.15 g/m², thereby preparing Lithographic printing plate precursors (1) to (150) for Examples 1 to 150 and Lithographic printing plate precursor (152) to (174) for Comparative Examples 1 to 23, respectively.

Further, Lithographic printing plate precursor (151) for Example 151 was prepared by forming a protective layer in the same manner as in Lithographic printing plate precursor (13) except for using Coating solution (2) for protective layer having the composition shown below in place of Coating solution (1) for protective layer.

<Coating Solution (1) for Protective Layer>

| | |
|---|---|
| Dispersion of inorganic stratiform compound (1) shown below | 1.5 g |
| Hydrophilic polymer shown in Tables 10 to 14 (solid content) | 0.035 g |
| Aqueous 1% by weight solution of surfactant (EMALEX 710, produced by Nihon Emulsion Co., Ltd.) | 0.86 g |
| Ion-exchanged water | 6.54 g |

(Preparation of Dispersion of Inorganic Stratiform Compound (1))

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

<Coating Solution (2) for Protective Layer>

| | |
|---|---|
| Hydrophilic polymer 13 (solid content) | 0.035 g |
| Aqueous 1% by weight solution of surfactant (EMALEX 710, produced by Nihon Emulsion Co., Ltd.) | 0.86 g |
| Ion-exchanged water | 8.00 g |

[II] Evaluation of Lithographic Printing Plate Precursor

Using the lithographic printing plate precursors thus-obtained the on-press development property, ink-receptivity (initial ink receptivity and ink receptivity using a specific color ink) and printing durability were evaluated in the manner described below. The ink receptivity using a specific color ink was also evaluated in the case where the lithographic printing plate precursor was preserved.

(1) On-Press Development Property

Each of the lithographic printing plate precursors thus-obtained was exposed by LUXEL PLATESETTER T-6000III equipped with an infrared semiconductor laser, produced by FUJIFILM Corp. under the conditions of a rotational number of an external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and VALUES-G (N) Black Ink (produced by Dainippon Ink & Chemicals, Inc.), the dampening water and ink were supplied according to the standard automatic printing start method of LITHRONE 26 to conduct on-press development and printing on 100 sheets of TOKUBISHI Art Paper (76.5 kg) at a printing speed of 10,000 sheets per hour.

A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Tables 10 to 14.

(2) Ink Receptivity i) Initial Ink Receptivity

A number of the printing papers required until ink density on the printing paper corresponding to the exposed region of the image-recording layer reached to the standard density was measured as the initial ink receptivity. The results obtained are shown in Tables 10 to 14.

ii) Ink Receptivity Using Specific Color Ink (Immediately After Preparation and After Preservation)

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and EPPLE PANTONE BLAU 072C (produced by Epple AG), the dampening water and ink were supplied according to the standard automatic printing start method of LITHRONE 26 to conduct on-press development and printing on TOKUBISHI Art Paper (76.5 kg) at a printing speed of 10,000 sheets per hour. The 10,000$^{th}$ printing paper was sampled and an ink density of the 20% halftone dot of FM screen was measured using a Gretag densitometer. Based on the measured value, the ink receptivity was evaluated according to the criterion shown below. The results obtained are shown in Tables 10 to 14.

A: Ink density from 1.8 to 1.9. The ink density did not decrease at all and good ink receptivity was exhibited.
B: Ink density from 1.5 to 1.7. The ink density somewhat decreased but was at an acceptable level.
C: Ink density from 1.0 to 1.4. The ink density clearly decreased and was an unacceptable level.
D: Ink density of 0.9 or less. The ink density severely decreased and the ink receptivity was bad.

The result of the ink receptivity after preservation was obtained by after preserving the lithographic printing plate precursor at 60° C. for 4 days and conducting the evaluation described above.

(3) Printing Durability

After performing the evaluation for the on-press development property of the lithographic printing plate precursor immediately after the preparation described above, the printing was continued. As the increase in a number of printing papers, the image-recording layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the 100$^{th}$ paper of the printing was determined to evaluate the printing durability. The results obtained are shown in Tables 10 to 14.

TABLE 10

Examples 1 to 45

| | Hydrophilic Polymer Compound Number | Ink Receptivity | | | On-press Development Property (sheets) | Printing Durability (× 10$^5$ sheets) |
|---|---|---|---|---|---|---|
| | | Initial Ink Receptivity (sheets) | Ink Receptivity using Specific Color Ink | | | |
| | | | Immediately after Preparation | After Preservation | | |
| Example 1 | 1 | 20 | B | B | 15 | 5 |
| Example 2 | 2 | 15 | A | A | 15 | 5 |
| Example 3 | 3 | 15 | A | A | 15 | 5 |
| Example 4 | 4 | 15 | A | A | 15 | 5 |
| Example 5 | 5 | 15 | A | A | 15 | 5 |
| Example 6 | 6 | 15 | A | A | 20 | 5 |
| Example 7 | 7 | 15 | A | A | 20 | 5 |
| Example 8 | 8 | 15 | A | A | 20 | 5 |
| Example 9 | 9 | 15 | A | A | 20 | 5 |
| Example 10 | 10 | 20 | B | B | 15 | 5 |
| Example 11 | 11 | 15 | A | A | 15 | 5 |
| Example 12 | 12 | 15 | A | A | 15 | 5 |
| Example 13 | 13 | 15 | A | A | 15 | 5 |
| Example 14 | 14 | 15 | A | A | 15 | 5 |
| Example 15 | 15 | 15 | A | A | 20 | 5 |
| Example 16 | 16 | 15 | A | A | 20 | 5 |
| Example 17 | 17 | 15 | A | A | 20 | 5 |
| Example 18 | 18 | 15 | A | A | 20 | 5 |
| Example 19 | 19 | 20 | B | B | 15 | 5 |
| Example 20 | 20 | 15 | A | A | 15 | 5 |
| Example 21 | 21 | 15 | A | A | 15 | 5 |
| Example 22 | 22 | 15 | A | A | 15 | 5 |
| Example 23 | 23 | 15 | A | A | 15 | 5 |
| Example 24 | 24 | 15 | A | A | 20 | 5 |
| Example 25 | 25 | 15 | A | A | 20 | 5 |
| Example 26 | 26 | 15 | A | A | 20 | 5 |
| Example 27 | 27 | 15 | A | A | 20 | 5 |
| Example 28 | 28 | 20 | B | B | 15 | 5 |
| Example 29 | 29 | 15 | A | A | 15 | 5 |
| Example 30 | 30 | 15 | A | A | 15 | 5 |
| Example 31 | 31 | 15 | A | A | 15 | 5 |
| Example 32 | 32 | 15 | A | A | 15 | 5 |

TABLE 10-continued

Examples 1 to 45

|  | Hydrophilic Polymer Compound Number | Initial Ink Receptivity (sheets) | Ink Receptivity using Specific Color Ink | | On-press Development Property (sheets) | Printing Durability ($\times 10^5$ sheets) |
|---|---|---|---|---|---|---|
|  |  |  | Immediately after Preparation | After Preservation |  |  |
| Example 33 | 33 | 15 | A | A | 20 | 5 |
| Example 34 | 34 | 15 | A | A | 20 | 5 |
| Example 35 | 35 | 15 | A | A | 20 | 5 |
| Example 36 | 36 | 15 | A | A | 20 | 5 |
| Example 37 | 37 | 20 | B | B | 15 | 5 |
| Example 38 | 38 | 15 | A | A | 15 | 5 |
| Example 39 | 39 | 15 | A | A | 15 | 5 |
| Example 40 | 40 | 15 | A | A | 15 | 5 |
| Example 41 | 41 | 15 | A | A | 15 | 5 |
| Example 42 | 42 | 15 | A | A | 20 | 5 |
| Example 43 | 43 | 15 | A | A | 20 | 5 |
| Example 44 | 44 | 15 | A | A | 20 | 5 |
| Example 45 | 45 | 15 | A | A | 20 | 5 |

TABLE 11

Examples 46 to 81

|  | Hydrophilic Polymer Compound Number | Initial Ink Receptivity (sheets) | Ink Receptivity using Specific Color Ink | | On-press Development Property (sheets) | Printing Durability ($\times 10^5$ sheets) |
|---|---|---|---|---|---|---|
|  |  |  | Immediately after Preparation | After Preservation |  |  |
| Example 46 | 46 | 20 | B | B | 15 | 5 |
| Example 47 | 47 | 15 | A | A | 15 | 5 |
| Example 48 | 48 | 15 | A | A | 15 | 5 |
| Example 49 | 49 | 15 | A | A | 15 | 5 |
| Example 50 | 50 | 15 | A | A | 15 | 5 |
| Example 51 | 51 | 15 | A | A | 20 | 5 |
| Example 52 | 52 | 15 | A | A | 20 | 5 |
| Example 53 | 53 | 15 | A | A | 20 | 5 |
| Example 54 | 54 | 15 | A | A | 20 | 5 |
| Example 55 | 55 | 20 | B | B | 15 | 5 |
| Example 56 | 56 | 15 | A | A | 15 | 5 |
| Example 57 | 57 | 15 | A | A | 15 | 5 |
| Example 58 | 58 | 15 | A | A | 15 | 5 |
| Example 59 | 59 | 15 | A | A | 15 | 5 |
| Example 60 | 60 | 15 | A | A | 20 | 5 |
| Example 61 | 61 | 15 | A | A | 20 | 5 |
| Example 62 | 62 | 15 | A | A | 20 | 5 |
| Example 63 | 63 | 15 | A | A | 20 | 5 |
| Example 64 | 64 | 15 | A | A | 20 | 5 |
| Example 65 | 65 | 15 | A | A | 20 | 5 |
| Example 66 | 66 | 20 | B | B | 15 | 5 |
| Example 67 | 67 | 20 | B | B | 15 | 5 |
| Example 68 | 68 | 20 | B | B | 15 | 5 |
| Example 69 | 69 | 20 | B | B | 15 | 5 |
| Example 70 | 70 | 20 | B | B | 15 | 5 |
| Example 71 | 71 | 20 | B | B | 15 | 5 |
| Example 72 | 72 | 20 | B | B | 15 | 5 |
| Example 73 | 73 | 15 | A | A | 20 | 5 |
| Example 74 | 74 | 15 | A | A | 20 | 5 |
| Example 75 | 75 | 20 | B | B | 15 | 5 |
| Example 76 | 76 | 20 | B | B | 15 | 5 |
| Example 77 | 77 | 20 | B | B | 15 | 5 |
| Example 78 | 78 | 20 | B | B | 15 | 5 |
| Example 79 | 79 | 20 | B | B | 15 | 5 |
| Example 80 | 80 | 20 | B | B | 15 | 5 |
| Example 81 | 81 | 20 | B | B | 15 | 5 |

TABLE 12

Examples 82 to 117

| | Hydrophilic Polymer Compound Number | Initial Ink Receptivity (sheets) | Ink Receptivity using Specific Color Ink — Immediately after Preparation | Ink Receptivity using Specific Color Ink — After Preservation | On-press Development Property (sheets) | Printing Durability (× $10^5$ sheets) |
|---|---|---|---|---|---|---|
| Example 82 | 82 | 15 | A | A | 20 | 5 |
| Example 83 | 83 | 15 | A | A | 17 | 5 |
| Example 84 | 84 | 15 | A | A | 17 | 5 |
| Example 85 | 85 | 15 | A | A | 15 | 5 |
| Example 86 | 86 | 15 | A | A | 20 | 5 |
| Example 87 | 87 | 15 | A | A | 17 | 5 |
| Example 88 | 88 | 15 | A | A | 17 | 5 |
| Example 89 | 89 | 15 | A | A | 15 | 5 |
| Example 90 | 90 | 15 | A | A | 20 | 5 |
| Example 91 | 91 | 15 | A | A | 17 | 5 |
| Example 92 | 92 | 15 | A | A | 17 | 5 |
| Example 93 | 93 | 15 | A | A | 15 | 5 |
| Example 94 | 94 | 15 | A | A | 20 | 5 |
| Example 95 | 95 | 15 | A | A | 17 | 5 |
| Example 96 | 96 | 15 | A | A | 17 | 5 |
| Example 97 | 97 | 15 | A | A | 15 | 5 |
| Example 98 | 98 | 15 | A | A | 20 | 5 |
| Example 99 | 99 | 15 | A | A | 17 | 5 |
| Example 100 | 100 | 15 | A | A | 17 | 5 |
| Example 101 | 101 | 15 | A | A | 15 | 5 |
| Example 102 | 102 | 15 | A | A | 20 | 5 |
| Example 103 | 103 | 15 | A | A | 17 | 5 |
| Example 104 | 104 | 15 | A | A | 17 | 5 |
| Example 105 | 105 | 15 | A | A | 15 | 5 |
| Example 106 | 106 | 15 | A | A | 20 | 5 |
| Example 107 | 107 | 15 | A | A | 17 | 5 |
| Example 108 | 108 | 15 | A | A | 17 | 5 |
| Example 109 | 109 | 15 | A | A | 15 | 5 |
| Example 110 | 110 | 15 | A | A | 20 | 5 |
| Example 111 | 111 | 15 | A | A | 17 | 5 |
| Example 112 | 112 | 15 | A | A | 17 | 5 |
| Example 113 | 113 | 15 | A | A | 15 | 5 |
| Example 114 | 114 | 15 | A | A | 20 | 5 |
| Example 115 | 115 | 15 | A | A | 17 | 5 |
| Example 116 | 116 | 15 | A | A | 17 | 5 |
| Example 117 | 117 | 15 | A | A | 15 | 5 |

TABLE 13

Examples 118 to 141

| | Hydrophilic Polymer Compound Number | Initial Ink Receptivity (sheets) | Ink Receptivity using Specific Color Ink — Immediately after Preparation | Ink Receptivity using Specific Color Ink — After Preservation | On-press Development Property (sheets) | Printing Durability (× $10^5$ sheets) |
|---|---|---|---|---|---|---|
| Example 118 | 118 | 17 | B | B | 13 | 5 |
| Example 119 | 119 | 17 | B | B | 13 | 5 |
| Example 120 | 120 | 15 | A | A | 15 | 5 |
| Example 121 | 121 | 15 | A | A | 17 | 5 |
| Example 122 | 122 | 17 | B | B | 13 | 5 |
| Example 123 | 123 | 17 | B | B | 13 | 5 |
| Example 124 | 124 | 15 | A | A | 15 | 5 |
| Example 125 | 125 | 15 | A | A | 17 | 5 |
| Example 126 | 126 | 17 | B | B | 13 | 5 |
| Example 127 | 127 | 17 | B | B | 13 | 5 |
| Example 128 | 128 | 15 | A | A | 15 | 5 |
| Example 129 | 129 | 15 | A | A | 17 | 5 |
| Example 130 | 130 | 17 | B | B | 13 | 5 |
| Example 131 | 131 | 17 | B | B | 13 | 5 |
| Example 132 | 132 | 15 | A | A | 15 | 5 |
| Example 133 | 133 | 15 | A | A | 17 | 5 |

TABLE 13-continued

Examples 118 to 141

| | Hydrophilic Polymer Compound Number | Initial Ink Receptivity (sheets) | Ink Receptivity using Specific Color Ink Immediately after Preparation | Ink Receptivity using Specific Color Ink After Preservation | On-press Development Property (sheets) | Printing Durability (× 10⁵ sheets) |
|---|---|---|---|---|---|---|
| Example 134 | 134 | 17 | B | B | 13 | 5 |
| Example 135 | 135 | 17 | B | B | 13 | 5 |
| Example 136 | 136 | 15 | A | A | 15 | 5 |
| Example 137 | 137 | 15 | A | A | 17 | 5 |
| Example 138 | 138 | 17 | B | B | 13 | 5 |
| Example 139 | 139 | 17 | B | B | 13 | 5 |
| Example 140 | 140 | 15 | A | A | 15 | 5 |
| Example 141 | 141 | 15 | A | A | 17 | 5 |

TABLE 14

Examples 142 to 151 and Comparative Examples 1 to 23

| | Hydrophilic Polymer Compound Number | Initial Ink Receptivity (sheets) | Ink Receptivity using Specific Color Ink Immediately after Preparation | Ink Receptivity using Specific Color Ink After Preservation | On-press Development Property (sheets) | Printing Durability (× 10⁵ sheets) |
|---|---|---|---|---|---|---|
| Example 118 | 142 | 17 | B | B | 13 | 5 |
| Example 83 | 143 | 17 | B | B | 13 | 5 |
| Example 84 | 144 | 15 | A | A | 17 | 5 |
| Example 85 | 145 | 17 | B | B | 13 | 5 |
| Example 86 | 146 | 17 | B | B | 13 | 5 |
| Example 87 | 147 | 15 | A | A | 17 | 5 |
| Example 88 | 148 | 17 | B | B | 13 | 5 |
| Example 89 | 149 | 17 | B | B | 13 | 5 |
| Example 90 | 150 | 15 | A | A | 17 | 5 |
| Example 91 | 13 | 17 | B | B | 20 | 3 |
| Comparative Example 1 | 151 | 25 | C | D | 30 | 5 |
| Comparative Example 2 | 152 | 25 | C | D | 30 | 5 |
| Comparative Example 3 | 153 | 25 | C | D | 30 | 5 |
| Comparative Example 4 | 154 | 25 | C | D | 30 | 5 |
| Comparative Example 5 | 155 | 25 | C | D | 30 | 5 |
| Comparative Example 6 | 156 | 25 | C | D | 30 | 5 |
| Comparative Example 7 | 157 | 25 | C | D | 30 | 5 |
| Comparative Example 8 | 158 | 25 | C | D | 30 | 5 |
| Comparative Example 9 | 159 | 25 | C | D | 30 | 5 |
| Comparative Example 10 | 160 | 25 | C | D | 30 | 5 |
| Comparative Example 11 | 161 | 25 | C | D | 30 | 5 |
| Comparative Example 12 | 162 | 25 | C | D | 30 | 5 |
| Comparative Example 13 | 163 | 25 | C | D | 30 | 5 |
| Comparative Example 14 | 164 | 25 | C | D | 30 | 5 |
| Comparative Example 15 | 165 | 25 | C | D | 30 | 5 |
| Comparative Example 16 | 166 | 25 | C | D | 30 | 5 |
| Comparative Example 17 | 167 | 25 | C | D | 30 | 5 |

TABLE 14-continued

Examples 142 to 151 and Comparative Examples 1 to 23

| | Hydrophilic Polymer Compound Number | Ink Receptivity | | | On-press Development Property (sheets) | Printing Durability ($\times 10^5$ sheets) |
|---|---|---|---|---|---|---|
| | | Initial Ink Receptivity (sheets) | Ink Receptivity using Specific Color Ink | | | |
| | | | Immediately after Preparation | After Preservation | | |
| Comparative Example 18 | 168 | 25 | C | D | 30 | 5 |
| Comparative Example 19 | 169 | 25 | C | D | 30 | 5 |
| Comparative Example 20 | 170 | 25 | C | D | 30 | 5 |
| Comparative Example 21 | 171 | 25 | C | D | 30 | 5 |
| Comparative Example 22 | 172 | 25 | C | D | 30 | 5 |
| Comparative Example 23 | 173 | 25 | C | D | 30 | 5 |

The structures of the various Hydrophilic polymers 151 to 173 used in the comparative examples are shown below.

Compound numbers 151 to 168 of the hydrophilic polymer are copolymers of acrylamide of formula (1) and comparative copolymerization units in a copolymerization composition ratio of 80/20 (% by mole), respectively. Compound numbers 169 to 173 of the hydrophilic polymer are homopolymers, respectively. The Mw of each hydrophilic polymer is 30,000.

TABLE 15

Hydrophilic Polymers used in Comparative Examples

Comparative Copolymerization Unit

Formula (1)  151  152  153  154

Comparative Copolymerization Unit

Formula (1)  155  156  157  157

Comparative Copolymerization Unit

Formula (1)  158  159  160

TABLE 15-continued

Hydrophilic Polymers used in Comparative Examples

| | Comparative Copolymerization Unit | | |
|---|---|---|---|
| Formula (1) | 161 | 162 | 163 |

| | Comparative Copolymerization Unit | | | | |
|---|---|---|---|---|---|
| Formula (1) | 164 | 165 | 166 | 167 | 168 |

| | Structure of Homopolymer | | | | |
|---|---|---|---|---|---|
| Compound Number | 169 | 170 | 171 | 172 | 173 |

What is claimed is:

1. A lithographic printing plate precursor comprising, in the following order:
   a support;
   an image-recording layer which is capable of forming an image by removing an unexposed area with at least one of printing ink and dampening water on a printing machine after exposure and contains (A) an infrared absorbing dye, (B) a polymerization initiator, (C) a polymerizable compound and (D) a binder polymer having an alkylene oxide group; and
   a protective layer containing (E) a hydrophilic polymer containing at least a repeating unit represented by the following formula (1) and a repeating unit represented by the following formula (2):

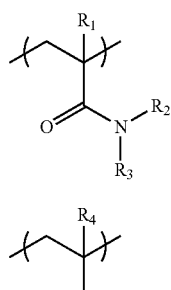

wherein, in the formulae (1) and (2), $R_1$ and $R_4$ each independently represents a hydrogen atom or a methyl group, $R_2$ and $R_3$ are hydrogen atoms, and $R_5$ is an unsubstituted straight-chain, branched or cyclic alkyl group having from 2 to 8 carbon atoms.

2. The lithographic printing plate precursor as claimed in claim 1, wherein the protective layer contains (F) an inorganic stratiform compound.

3. The lithographic printing plate precursor as claimed in claim 1, wherein the image-recording layer further contains (G) a hydrophobilizing precursor.

4. The lithographic printing plate precursor as claimed in claim 2, wherein the image-recording layer further contains (G) a hydrophobilizing precursor.

5. A plate making method comprising:
   exposing imagewise the lithographic printing plate precursor as claimed in claim 1; and
   removing an unexposed area of the image-recording layer by supplying at least one of printing ink and dampening water to the exposed lithographic printing plate precursor mounted on a printing machine.

6. The lithographic printing plate precursor as claimed in claim 1, wherein the hydrophilic polymer comprises from 70 to 80% by mole of the repeating unit represented by formula (1).

7. The lithographic printing plate precursor as claimed in claim 6, wherein the hydrophilic polymer comprises from 20 to 30% by mole of the repeating unit represented by formula (2).

8. The lithographic printing plate precursor as claimed in claim 1, wherein $R_5$ in formula (2) is an alkyl group having 3 or 4 carbon atoms.

* * * * *

UNITED STATES PATENT AND TRADEMARK OFFICE
CERTIFICATE OF CORRECTION

| | | |
|---|---|---|
| PATENT NO. | : 8,603,729 B2 | Page 1 of 1 |
| APPLICATION NO. | : 13/221545 | |
| DATED | : December 10, 2013 | |
| INVENTOR(S) | : Shota Suzuki et al. | |

It is certified that error appears in the above-identified patent and that said Letters Patent is hereby corrected as shown below:

ON THE TITLE PAGE:

At item (45), Date of Patent, change "Dec. 10, 2013" to --*Dec. 10, 2013--.

At item (*) Notice, please insert the following as a new paragraph after the printed notice:

--This patent is subject to a terminal disclaimer.--

Signed and Sealed this
Thirteenth Day of May, 2014

Michelle K. Lee
*Deputy Director of the United States Patent and Trademark Office*